United States Patent [19]
Sawase

[11] Patent Number: 6,052,314
[45] Date of Patent: Apr. 18, 2000

[54] EEPROM DEVICE

[75] Inventor: Kensuke Sawase, Kyoto, Japan

[73] Assignee: Rohm Co., Ltd., Kyoto, Japan

[21] Appl. No.: 09/083,121

[22] Filed: May 22, 1998

[30] Foreign Application Priority Data

May 22, 1997 [JP] Japan .................................. 9-131852
Jun. 18, 1997 [JP] Japan .................................. 9-160746

[51] Int. Cl.$^7$ ............................................ G11C 7/00
[52] U.S. Cl. .............. 365/189.05; 365/218; 365/189.01; 365/185.02; 365/185.29
[58] Field of Search ...................... 326/38; 365/185.01, 365/189.05, 218, 189.01, 185.02, 185.29

[56] References Cited

U.S. PATENT DOCUMENTS

| | | | |
|---|---|---|---|
| 5,436,913 | 7/1995 | Yamamura et al. ................... | 371/21.2 |
| 5,650,734 | 7/1997 | Chu et al. ................................ | 326/38 |
| 5,801,989 | 9/1998 | Lee et al. .............................. | 365/185.2 |
| 5,807,126 | 9/1998 | Bethurum . | |
| 5,818,791 | 10/1998 | Tanaka et al. ...................... | 365/230.06 |
| 5,869,980 | 2/1999 | Chu et al. ................................. | 326/38 |

*Primary Examiner*—Viet Q. Nguyen
*Attorney, Agent, or Firm*—Nikaido Marmelstein Murray & Oram LLP

[57] ABSTRACT

An EEPROM device has an array of memory cells composed of nonvolatile data-storage elements that allow electrical writing and erasing of data. The array of memory cells is provided with an area for storing data representing the length of writing time for which the writing and erasing of data are performed. The writing-time data is read out from this area and held in a latch circuit. The latched data is used as the target count up to which a counter counts a clock. The counter starts counting in response to a start signal and stops counting when the actual count reaches the target count. The counter, while it is counting, outputs a high-level signal, which determines the length of writing time for which writing is performed in the memory cells.

7 Claims, 14 Drawing Sheets

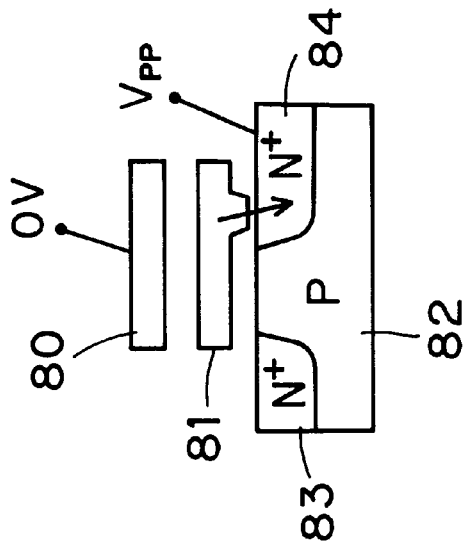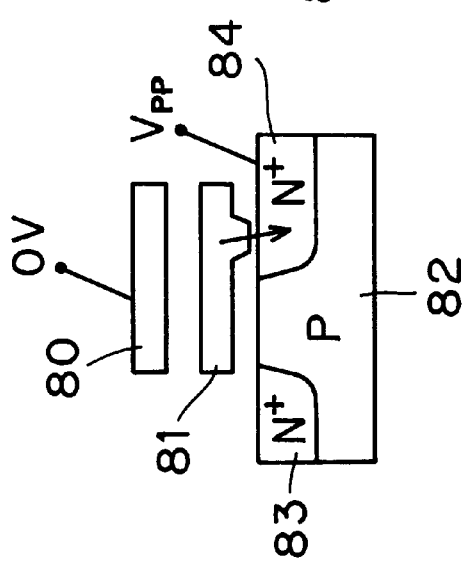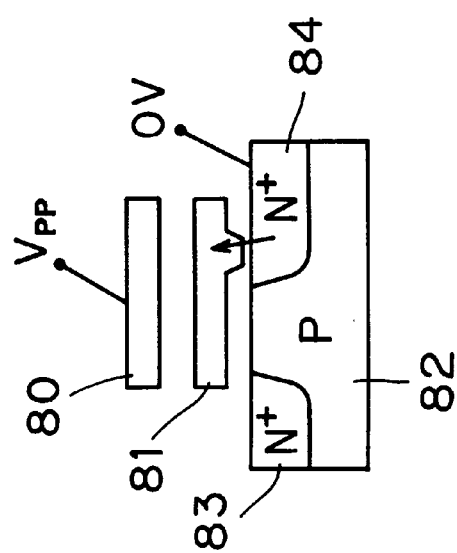

Fig.12

| D8 | D7 | D6 | D5 | D4 | D3 | D2 | D1 |

Fig.13

| D8 | D6 | D4 | D2 |
|----|----|----|----|
| D7 | D5 | D3 | D1 |

EEPROM DEVICE

BACKGROUND OF THE INVENTION

1. Field of the Invention

The present invention relates to an EEPROM (electrically erasable programmable read-only memory) device having an array of memory cells composed of nonvolatile data-storage elements.

2. Description of the Prior Art

An EEPROM device achieves the erasing and writing of data electrically by injecting and ejecting electrons to and from floating gates. To achieve this, an EEPROM device exploits the current that is caused to flow through an oxide film or the like by the tunnel effect when a high-level voltage is applied to the oxide film. However, applying a uniform writing time to every individual EEPROM device leads to the problem described below because of the considerably large variations in the characteristics of EEPROM devices that cannot be avoided in their manufacturing process (note that, in the present specification, a "writing time" signifies the length of time required to complete a cycle of erasing and writing operations in a memory cell).

Specifically, a long writing time causes, in memory cells that exhibit good electron injection and ejection characteristics, an increase in the rate at which electrons are injected and ejected. This leads to the dielectric breakdown of tunnel oxide films and thus to the degradation of their characteristics. However, in memory cells that are poor in the above-mentioned characteristics, a long writing time allows data to be written securely and thus leads to an increased yield of EEPROM devices. By contrast, a short writing time leads, in memory cells that are good in the above-mentioned characteristics, to an increased yield but, in memory cells that are poor in the above-mentioned characteristics, to data errors due to insufficient electron injection and ejection.

To overcome this problem, some conventional EEPROM devices are designed to use a variable writing time. An example of such EEPROM devices is proposed, for example, in Japanese patent No. 2,510,521. In this conventional EEPROM device, a clock generated by an oscillation circuit is divided by a frequency divider into a plurality of reference signals divided in different ratios, and the writing time is varied by selecting a different one of these reference signals.

However, in this conventional EEPROM device, it is impractical to increase the number of reference signals above a certain limit, and therefore the writing time can be varied only in a limited number of steps. Moreover, to make the selection of the frequency-division ratio possible, it is necessary to provide, separately from the memory cell array, a data-storage element dedicated to the storage of data related to the frequency-division ratio. This necessitates the use of, for example, a polyfuse and thus leads to a larger chip area, because the polyfuse requires sufficient extra space to place position indication marks that are referred to when the polyfuse is cut with a laser beam and to prevent the effect of the cutting on the portion around the polyfuse.

SUMMARY OF THE INVENTION

An object of the present invention is to provide a variable-writing-time EEPROM device that can vary its writing time in finer steps than ever and thereby helps enhance its yield.

To achieve the above object, according to the present invention, an EEPROM device having an array of memory cells composed of nonvolatile data-storage elements that permit electrical writing and erasing of data is provided with an area, provided in the array of memory cells, for storing data representing the length of time for which the writing and erasing of data are performed; a latch circuit for reading out the data from this area and holding the data; and a counter for counting a clock generated by an oscillation circuit. In this EEPROM device, the length of time for which the writing and erasing are performed is varied by the counter in accordance with a signal from the latch circuit.

BRIEF DESCRIPTION OF THE DRAWINGS

This and other objects and features of the present invention will become clear from the following description, taken in conjunction with the preferred embodiments with reference to the accompanied drawings in which:

FIGS. 5A, 5B, and 5C are diagrams schematically illustrating the structure of one of the memory cells that compose the EEPROM of the invention;

FIG. 12 is a diagram explaining the operation of the data conversion circuit in the second embodiment;

FIG. 13 is another diagram explaining the operation of the data conversion circuit in the second embodiment;

DESCRIPTION OF THE PREFERRED EMBODIMENTS

Figure 1:
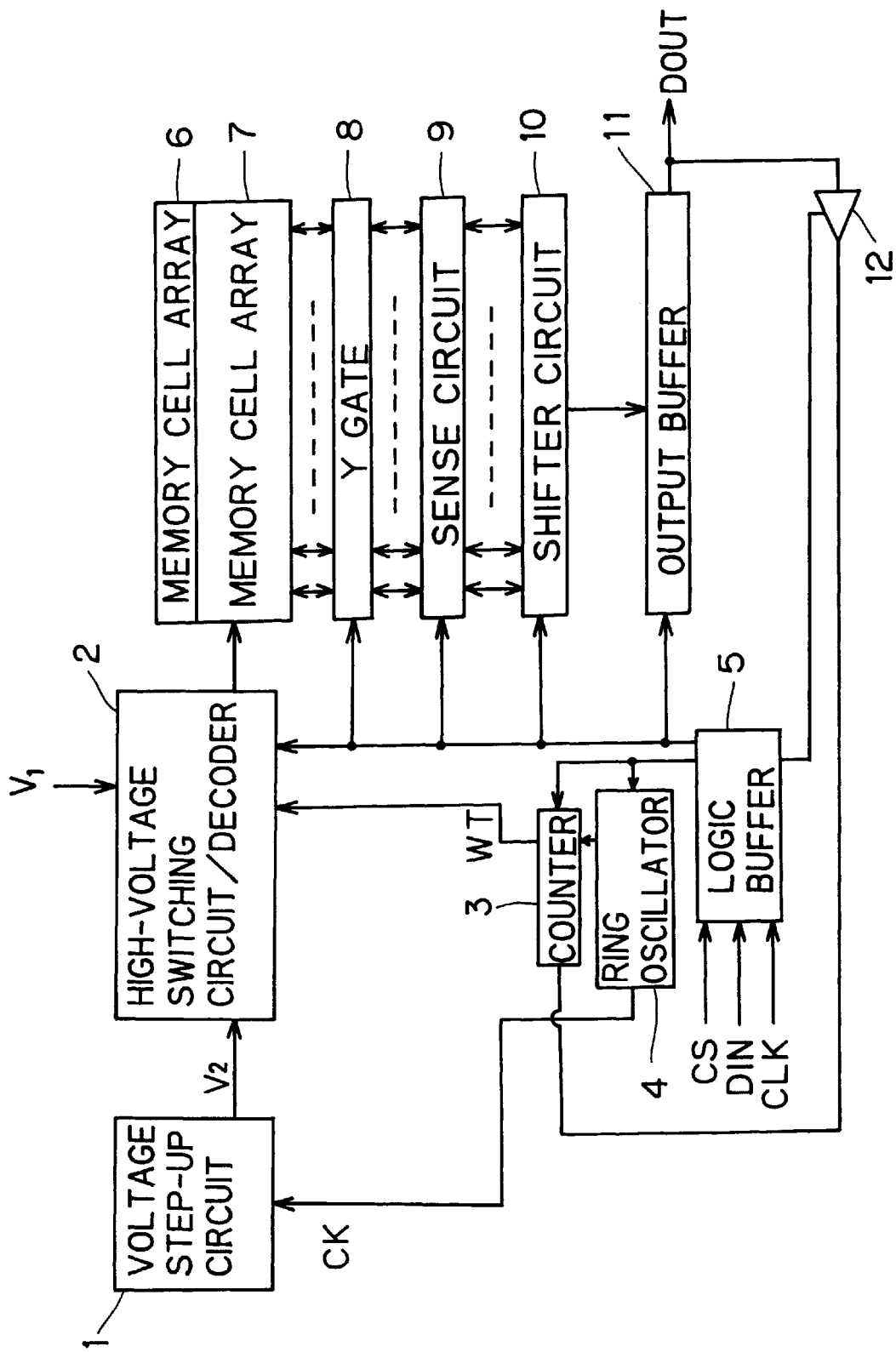
FIG. 1 is a block diagram of the EEPROM device of a first embodiment of the invention.

A first embodiment of the present invention will be described below with reference to FIGS. 1 to 4. FIG. 1 is a block diagram of the EEPROM device of the first embodiment. The EEPROM device of this embodiment inputs and outputs data by the use of a serial signal. The logic buffer 5 recognizes various instruction codes and the like by receiving a chip select signal CS, a data input signal DIN, and a clock CLK, and, in accordance thereto, performs various operations such as writing and reading of data. The EEPROM device is active and ready for use only when it is receiving the chip select signal CS; thus, the chip select signal CS is used to selectively activate one among a plurality of EEPROM devices.

The ring oscillator 4 is an oscillation circuit for generating the clock CK, and it feeds the clock CK to the voltage step-up circuit 1 and the counter 3. The voltage step-up circuit 1 is a circuit for increasing a voltage stepwvise, for example, by adding a clock signal to the voltage held across a step-up capacitor consisting of a plurality of capacitors.

The high-voltage switching circuit/decoder 2 has a circuit for selecting the power source voltage between a normal power source voltage $V_1$ and a high voltage $V_2$ produced by the voltage step-up circuit 1, and a decoder for decoding an address signal from the logic buffer 5. This high voltage is used to perform the writing and erasing of data, and the writing time (i.e. the length of time for which the writing of data is performed) is variable in accordance with a signal WT from the counter 3.

The memory cell arrays 6 and 7 are composed of non-volatile data-storage elements that are electrically rewritable. The memory cell array 6 provides an area for storing data representing the writing time; the memory cell array 7 provides an area for storing input data. The Y gate 8 decodes the address signal from the logic buffer 5. The sense circuit 9 evaluates the data stored in the memory cell arrays 6 and 7 at the address specified by the high-voltage switching circuit/decoder 2 and the Y gate 8.

The shifter circuit 10 converts a serial signal into parallel signals and vice versa. The shifter circuit 10 converts the data read out by the sense circuit 9 into parallel signals and feeds them to the output buffer 11. The output butter 11 holds the data temporarily and outputs a serial signal DOUT. When the signal DOUT is data representing the writing time read out from the memory cell array 6, the logic buffer 5 operates in such a way that the signal DOUT is transmitted through the buffer circuit 12 to the counter 3 and stored therein.

When data is read out from this EEPROM device, the signal DIN, which includes a read instruction code and an address, is fed to the logic buffer 5 in synchronism with the clock CK. The logic buffer 5, on recognizing the read instruction code, reads out from the input signal DIN the data at the address that is specified by the high-voltage switching circuit/decoder 2 and the Y gate 8, and the sense circuit 9 evaluates the data thus read out. Then, the shifter circuit 10 converts the data into a serial signal, and outputs it through the output buffer 11 as a signal DOUT. At this time, the high-voltage switching circuit/decoder 2 uses the normal power source voltage $V_1$, and does not use the high voltage $V_2$ from the voltage step-up circuit 1.

When data representing the writing time is stored in the memory array cell 6, the signal DIN, which this time includes a corresponding instruction code and the data to be stored, is fed to the logic buffer 5 in synchronism with the clock CK. As a result, the logic buffer 5 controls the high-voltage switching circuit/decoder 2 and the Y gate 8 in such a way that the data is stored in the memory cell array 6. As will be described later, the storing of this data is performed during the manufacture of the EEPROM device. After the manufacture, when the EEPROM device starts receiving the supply of power, the logic buffer 5 controls the buffer circuit 12 in such a way that the data, representing the writing time as read out from the memory cell array 6, is fed to the counter 3. This data is stored in the counter 3. When the supply of power is shut off, the data D0–DN on the writing time stored in the latch circuit 17 of the counter 3 is erased. When the supply of power is restarted, the data representing the writing time is latched by the latch circuit 17 anew through the above-described sequence of operations.

When input data is written to the memory cell array 7, the signal DIN, which this time includes a write instruction code, an address, and the data to be written, is fed to the logic buffer 5 in synchronism with the clock CLK. The logic buffer 5, on recognizing the write instruction code, converts the data, which it receives as a serial signal, into parallel signals by the use of the shifter circuit 10, and then writes the data at the address that is specified by the high-voltage switching circuit/decoder 2 and the Y gate 8. The writing time is variable in accordance with the signal WT from the counter 3. The high-voltage switching circuit/decoder 2 achieves the switching between the normal power source voltage and the high voltage, for example, by the use of a transistor designed for switching operations.

Figure 2:
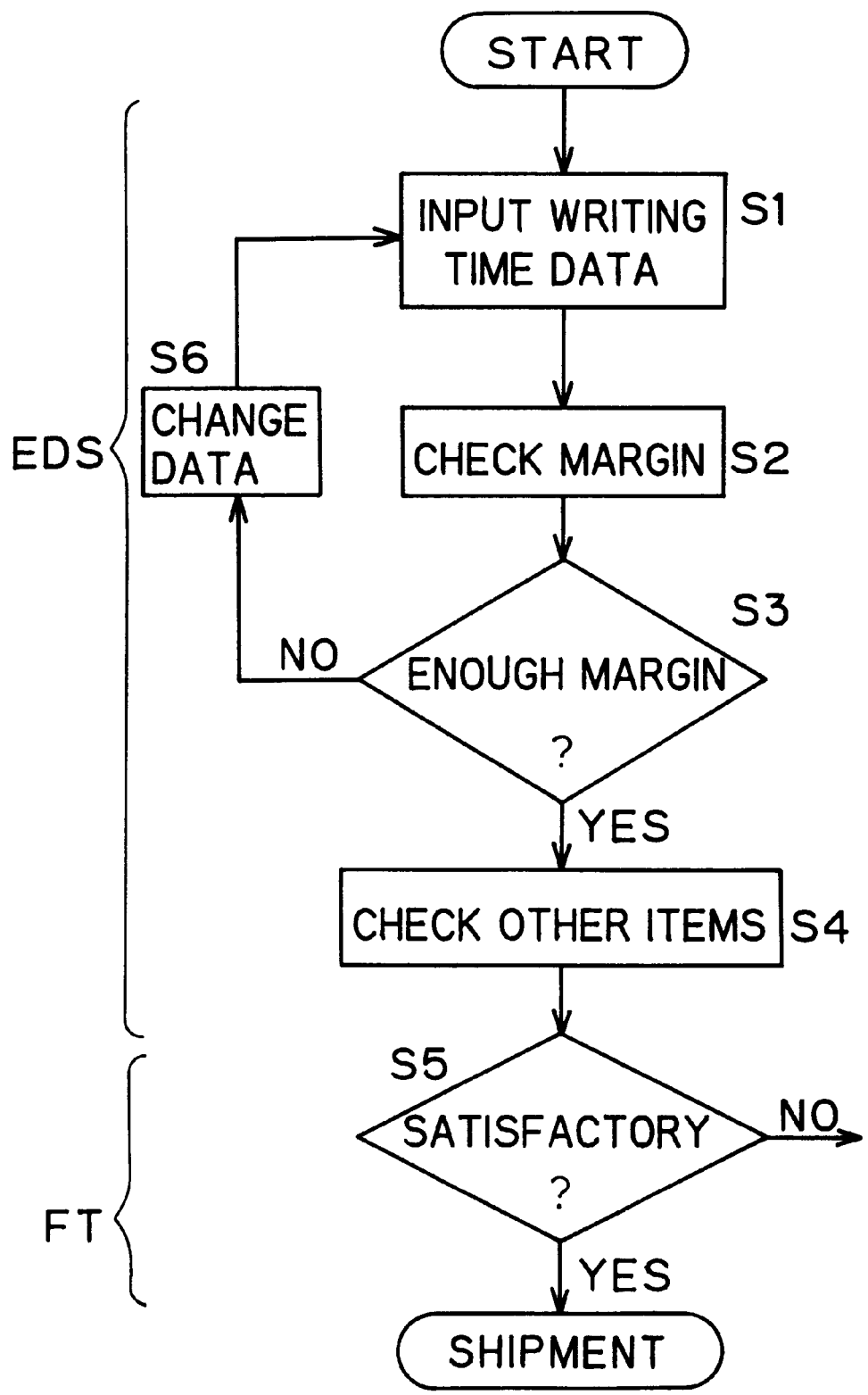
FIG. 2 is a flowchart of the basic method of determining the writing time in the first embodiment.

FIG. 2 shows the basic method of determining the writing time in this EEPROM device. First, in step S1, the EEPROM, in which no data representing the writing time is stored yet in the memory cell array 6 at this time, is fed with data representing a writing time. At this time, to perform the writing of the data securely, the logic buffer 5 feeds a data reset signal DR (to be described later) to the counter 3 so that the writing time is maximized.

Then, in step S2, as writing and reading operations are performed using the data, whether the threshold value has an optimal margin or not is checked. If the margin is found not optimal, then, in step S6, the data representing the writing time is changed, and then, back in step S1, the new data is fed to the EEPROM device to check the margin again. On the other hand, if, in step S3, the margin is found optimal, then, in step S4, other items are checked through tests such as logic tests and DC tests. The steps described hitherto are performed while the EEPROM device is still on a wafer and thus constitute an EDS (electrical die sort) process. If the EEPROM is found defective at this time, it is marked as such.

If the EEPROM is found not defective, it is packaged and then, in step S5, subjected to function testing (FT). The EEPROM is allowed to be shipped only when it passes the function tests. After the shipment of the EEPROM as an end product, when it starts receiving the supply of power, the data representing the writing time is automatically read out from the memory cell array 6 and fed to the counter 3.

Figure 3:
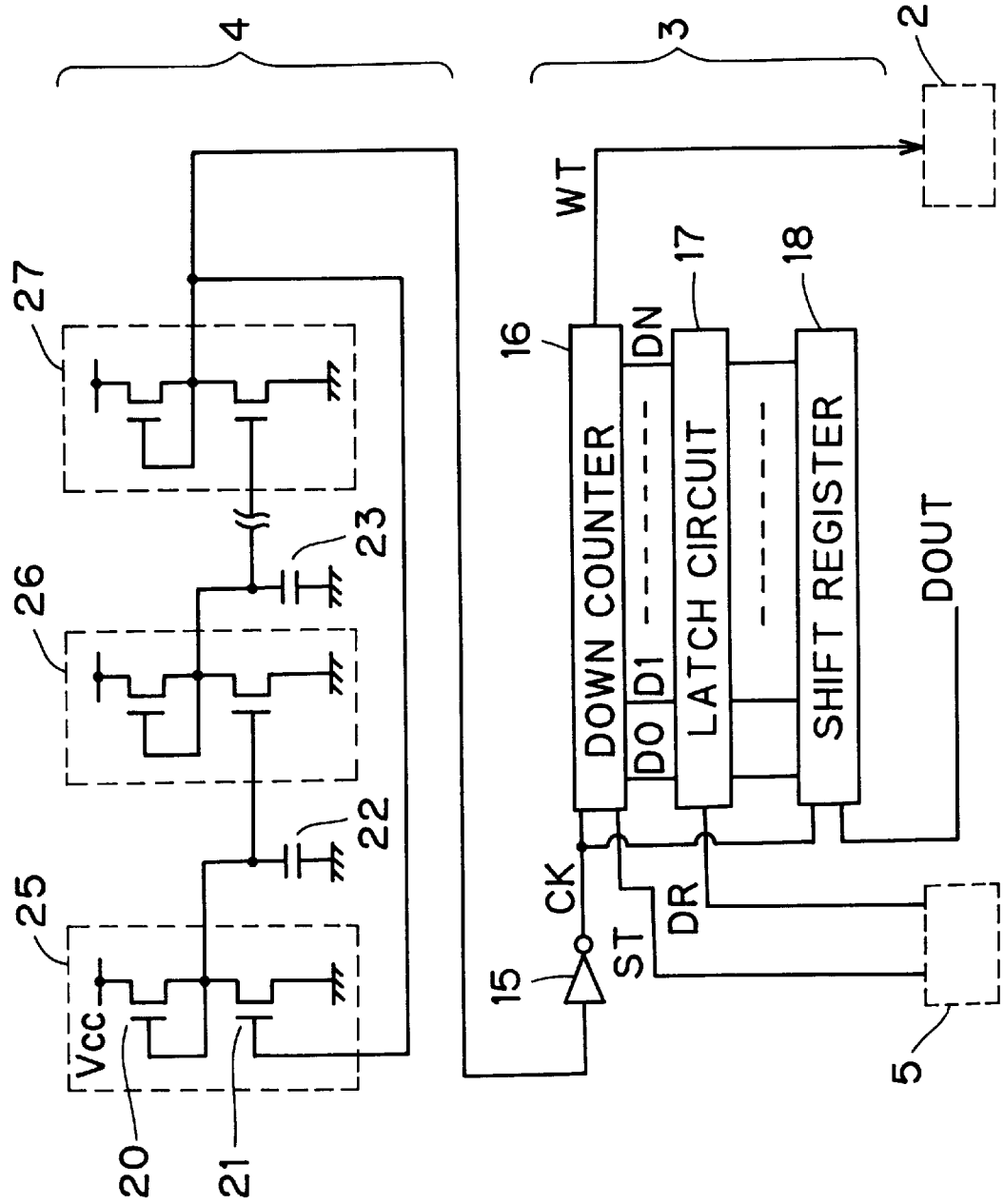
FIG. 3 is a circuit diagram of an example of the counter and the ring oscillator used in the first embodiment.

FIG. 3 is a circuit diagram of an example of the counter 3 and the ring oscillator 4. The ring oscillator 4 has a plurality of inverters 25, 26, . . . , 27, and has a plurality of capacitors 22, 23, . . . that are connected between the inverters 25, 26, . . . in such a way that each of the capacitors is charged by the output voltage of one of the inverters.

As shown for the inverter 25, the inverters 25, 26, . . . , 27 are each composed of a pair of serially connected n-channel MOSFETs (metal-oxide semiconductor field-effect transistors) 20 and 21. The transistor 20 has its drain connected to the power source voltage Vcc, and has its gate and source connected to the drain of the transistor 21. The transistor 21 has its source connected to ground, and has its gate connected to the output of the last-stage inverter 27. The output of the laststage inverter 27 is fed back to the first-stage inverter 25, and therefore the ring oscillator 4 oscillates and feeds its output as the clock CK to the counter 3. Note that there need to be an odd number of stages of inverters 25, 26, ..., 27.

In the counter 3, the clock CK fed from the ring oscillator 4 is inverted by an inverter 15 and fed to the down counter 16 and to the shift register 18. Moreover, when the supply of power is started, the signal DOUT is fed from the buffer circuit 12 to the shift register 18, and the data D0–DN consisting of N bits thus fed to the shift register 18 is held in the latch circuit 17. At this time, the data D0–DN represents the writing time as read out from the memory cell array 6. This data is fed to the down counter 16.

The down counter 16 starts counting the clock CK in response to a counter start signal ST fed from the logic buffer 5. On the other hand, the logic buffer 5 feeds a data reset signal DR to the latch circuit 17. When the signal DR is at a high level, the latch circuit 17 sets all the bits of the data D0–DN held therein to "1", regardless of what data it is, and then transmits it to the down counter 16.

The basic operation of the counter 3 is as follows. The down counter 16 starts counting the clock CK when it receives the counter start signal ST. When the count reaches the value represented by the data D0–DN, the down counter 16 is reset. The down counter 16 keeps its output signal WT at a high level while it is counting, and drops its output signal WT to a low level when it stops counting. The high-voltage switching circuit/decoder 2 uses the interval in which the signal WT is kept at a high level as the above-mentioned writing time.

The high-voltage switching circuit/decoder 2 has a switching circuit for switching between the voltages $V_1$ and $V_2$. The output voltage of this switching circuit is fed to a switching device that is turned on and off in accordance with the signal WT. This makes it possible to feed the output voltage of the switching circuit to the memory cell arrays in the intervals that correspond to the signal VT, that is, it is possible, during the writing of data, to vary the length of time for which a high voltage is applied to the memory cell arrays 6 and 7 in accordance with the signal WT. The writing time is longest when the data reset signal DR is at a high level.

Figure 4:
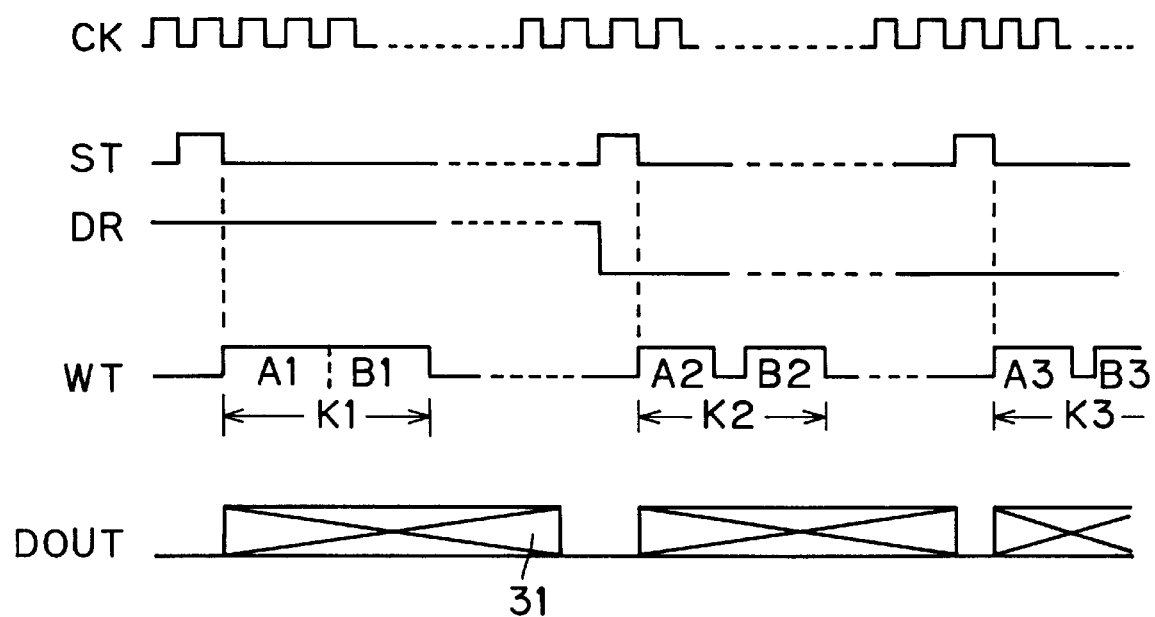
FIG. 4 is a timing chart of examples of some signals observed in the first embodiment.

FIG. 4 is a waveform chart illustrating an example of this operation. The signals CK, ST, and DR are signals that are fed to the counter 3 as described previously. The signal WT is a signal outputted from the counter 3. The signal DOUT is a signal outputted from the output buffer 11 (see FIG. 1), and, through the control by the logic buffer 5, part of this signal DOUT (i.e. the data representing the writing time) is fed to the counter 3.

The signal CK is repeated with a predetermined period. When the counter start signal ST appears while the data reset signal DR is at a high level, the signal WT outputted from the counter 3 has the longest erasing interval A1 and the longest writing time B1 as indicated by K1. On the other hand, when the data representing the writing time is stored in the memory cell array 6 as described previously with reference to FIG. 2, the logic buffer 5 keeps the data reset signal DR at a high level so that the writing will be performed securely.

As a result, the high-voltage switching circuit/decoder 2 performs erasing in the interval A1 and performs necessary writing in the interval B1. The writing time signifies the time required to complete a cycle of erasing and writing operations such as represented by the intervals A1 and B1. At this time, the data 31 of the signal DOUT is fed to the counter 3 so as to be held in the latch circuit 17. Thus, data needs to be written to the memory cell array 6 only once during the EDS process. This helps minimize the number of times of data writing, and makes it possible to secure a sufficiently long writing time as indicated by the interval K1 without causing any problem.

Next, when the logic buffer 5 drops the signal DR to a low level, and the counter start signal ST is fed to the counter 3 to cause the memory cell array 7 to store data, the down counter 16 sets the target count value in accordance with the data 31. This allows the erasing interval A2 and the writing interval B2 in the interval K2 to be varied in accordance with the data representing the writing time. In the embodiment under discussion, as the waveform of the signal WT shows, the erasing and writing intervals A2 and B2 are shorter than the intervals A1 and B1, respectively. The intervals A2 and B2 become shorter than the intervals A1 and B1, respectively, unless all the bits of the data D0–DN are "1".

Thereafter, as long as the data reset signal DR is kept at a low level, when the counter start signal ST appears next time, the erasing interval A3 and the writing interval B3 in the interval K3 are, in accordance with the previously-set writing-time data, set to be exactly as long as those in the interval K2. Also when the EEPROM device starts receiving the supply of power, the data representing the writing time is read out from the memory cell array 6 and held in the latch circuit 17.

As described above, in this embodiment, it is possible to set the writing time of EEPROM devices to an optimal value even though they have variations in their characteristics that cannot be avoided in their manufacturing process. This helps reduce the rejection rate in the EDS and FT processes. Specifically. the writing time can be made longer when the memory cell arrays 6 and 7 exhibit poor characteristics and shorter when they exhibit good characteristics. The data representing the writing time can be set during the EDS process, and therefore, for ordinary applications of EEPROM devices, it is not necessary to perform any extra operation for setting their writing time. It is likely that, in the future, for example as memory devices are made smaller and smaller, EEPROM devices will have larger variations in their characteristics; even then, however, the EEPROM device of this embodiment will offer high reliability and help achieve high yields.

The conventional EEPROM device described earlier Japanese patent No. 2,510,521) suffers not only from a poor resolution, but also from a larger chip area because it stores the data representing the writing time in an area separate from the memory cell array. By contrast, in this embodiment, part of the memory cell arrays 6 and 7, which are considered to form a single memory cell array as a whole, is used for the storage of such writing-time data, and, by operating a counter in accordance with the data stored in this area, the writing time is varied. As a result, it is possible to obtain a high resolution, and it is not necessary to use a polyfuse or the like. Moreover, since the writing of the data representing the writing time is performed in almost the same manner as the writing of ordinary data, the storage of such writing-time data can be achieved easily.

Note that the ring oscillator 4 shown in FIG. 3 is merely one example of the oscillation circuit that can be used there; that is, it may be replaced with a differently configured oscillation circuit. The counter 3 may also be configured differently, for example by the use of an up counter, as long as it operates in a similar manner. Moreover, it is also possible to obtain parallel-type EEPROM devices having a variable writing time by providing their memory cell array with an area for storing writing-time data in the same manner as with serial-type EEPROM devices.

In the embodiment under discussion, the data representing the writing time is read out from the memory cell array 6 when the supply of power is started. However, it is also possible to monitor the occurrence of writing and other operations so that the writing-time data is read out when a writing or other operation is performed for the first time.

FIGS. 5A and 5B show the sectional structure of the memory cell used in the EEPROM device described above. In the memory cell, a source 83 and a drain 84 are formed on a p-type substrate 82, and a control gate 80 and a floating gate 81 are formed over them with insulating oxide films in between. Part of the oxide film that exists between the floating gate 81 and the drain 84 is made thinner so that electrons can be injected and ejected through this part by the tunnel effect.

As shown in FIG. 5A, within one memory cell, the erasing of data is achieved by applying a high voltage Vpp of approximately 20 V to the control gate 80 and dropping the voltage at the drain 84 to 0 V (the ground level), because this causes electrons to be injected into the floating gate 81 from the drain 84 through the oxide film.

On the other hand, as shown in FIG. 5B, the writing of data is achieved by dropping the voltage at the control gate 80 to 0 V and applying the voltage Vpp to the drain 84, because this causes electrons to be ejected from the floating gate 81. In this way, electrical erasing and writing of data are achieved. In addition, in the first embodiment, the length of time for which the erasing and writing of data are to be performed is stored in the memory cell array so that it can be read out for use when the erasing and writing of data are actually performed. In this case, the data representing the time may be stored in a memory separate from the memory cell.

In each memory cell, the threshold voltage differs between in the erasing state and in the writing state. By detecting this difference in the threshold voltage as a current, it is possible to achieve the reading of data.

Figure 6A:
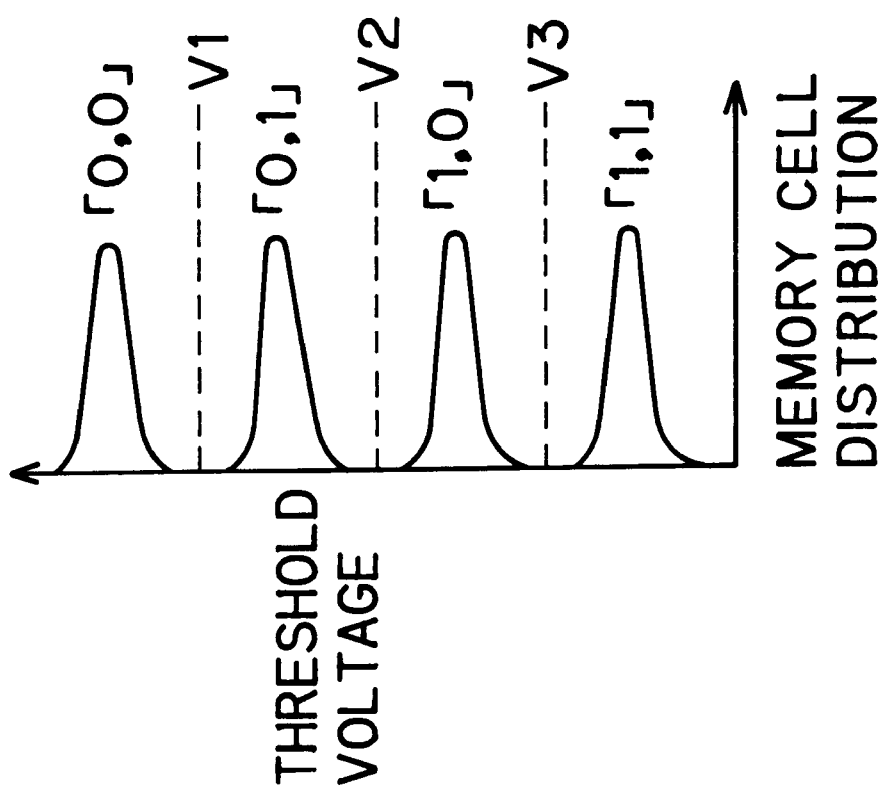
FIG. 6A is a diagram illustrating the memory cell distribution in terms of their threshold voltage in the case of a one-bit-per-cell configuration.

In an ordinary EEPROM device of a one-bit-per-cell configuration, as shown in FIG. 6A, the memory cells are, in terms of their threshold voltage, so distributed as to be divided into two groups on both sides of the reference voltage V0, with one group representing a binary "0" and the other group representing a binary "1" (i.e. each memory cell is brought into one of binary (two-valued) states). The present invention is applicable not only to EEPROM devices of a one-bit-per-cell configuration as shown in FIG. 6A, but also to EEPROM devices of, for example, a two-bits-per-cell configuration as shown in FIG. 6B, where data is stored by the use of three or more states each representing a different value (i.e. each memory cell is brought into one of multivalued states).

Figure 6B:
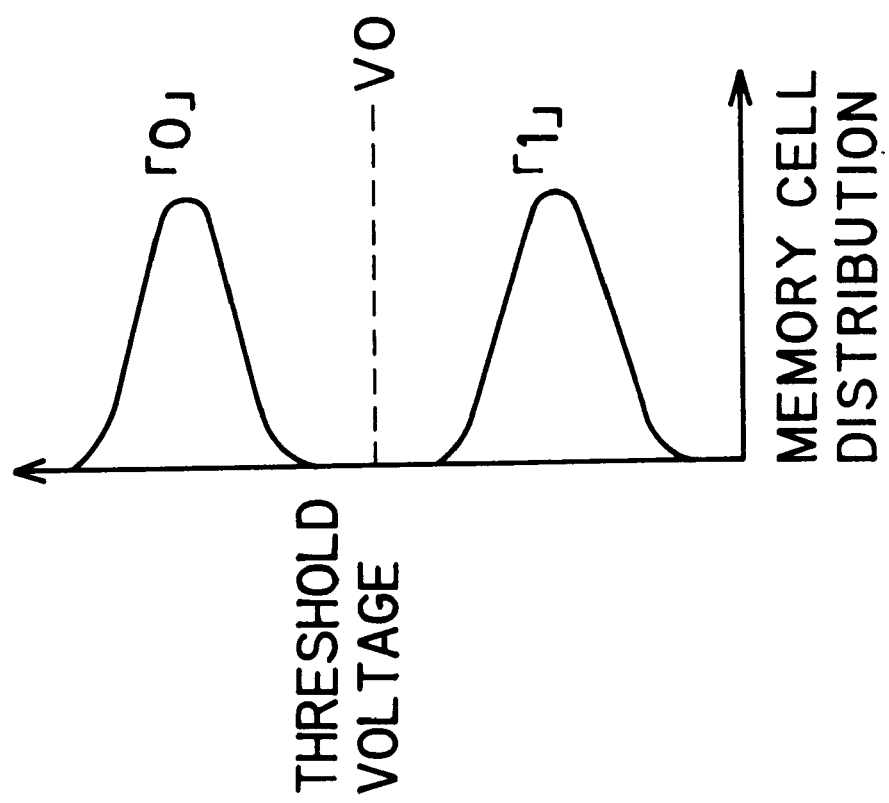
FIG. 6B is a diagram illustrating the memory cell distribution in terms of their threshold voltage within a production lot in the case of a turo-bits-per-cell configuration.

As shown in FIG. 6B, in an EEPROM device of a two-bits-per-cell configuration, the memory cells are, in terms of their threshold voltage, divided into four groups, which represent four-valued states "0, 0", "0, 1", "1, 0", and "1, 1", respectively. When data is read out, the state of each memory cell is evaluated by the use of three reference voltages V1 to V3.

Figure 7:
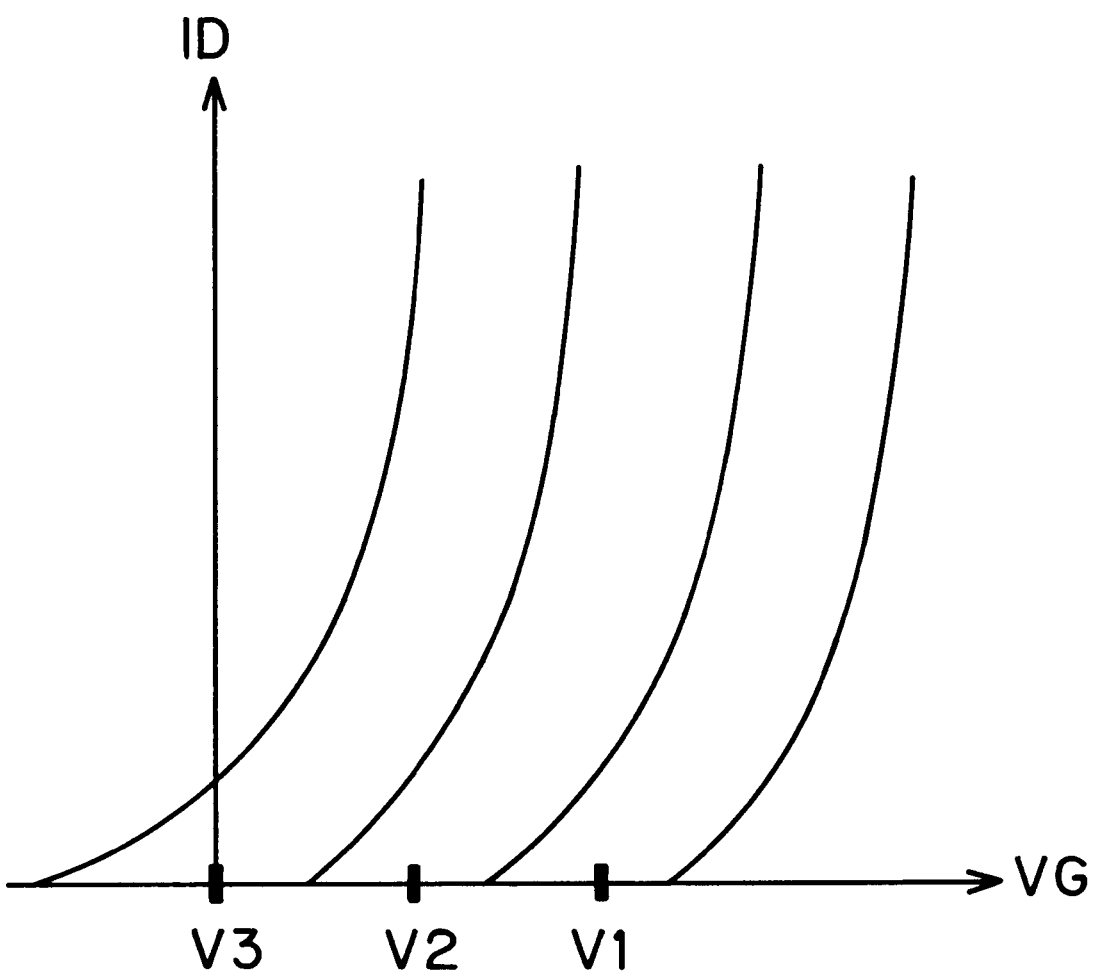
FIG. 7 is a diagram illustrating the gate voltage-current characteristic curve of a memory cell of a two-bits-per-cell configuration.

Specifically, in each memory cell, as shown in FIG. 7, three different reference voltages create four different characteristic curves. Accordingly, in this type of EEPROM device, data is read out by checking whether a current ID flows through a memory cell when its control gate voltage is made equal to each of the reference voltages V1 to V3.

However, as described earlier, EEPROM devices exhibit comparatively large variations in their characteristics in their manufacturing process, and, between production lots, the memory cell distribution shows overlapping areas between "0, 0" and "0, 1", between "0, 1" and "1, 0", and between "1, 0" and "1, 1". This means that using a larger number of values may lead to more frequent occurrences of erroneous data detection.

For this reason, in a second embodiment of the invention, an EEPROM device in which the storing of data in each memory cell is achieved by the use of three or more states each representing a different value is so designed that the data representing optimal writing times T1, T2, T3, and T4 is stored within each individual EEPROM device. That is, during the Ariting of data, a fixed voltage is applied between the control gate and the drain of a memory cell, and, by selecting a different one of T1, T2, T3, and T4 as the time for which the voltage is applied, it is possible to bring the memory cell into one of the four states. In so doing, the times T1, T2, T3, and T4 are determined not uniformly, but differently for individual EEPROM devices in consideration of the variations in their characteristics. Based on this data, the actual lengths of time are determined. As a result, the EEPROM device performs data conversion by automatically using appropriate lengths of time as the writing time. This helps reduce the width of the distribution of the memory cells in terms of their threshold voltage and thereby enhance the writing accuracy of the reference voltages V1 to V3. As a result, it is possible to achieve an increased yield.

Figure 8:
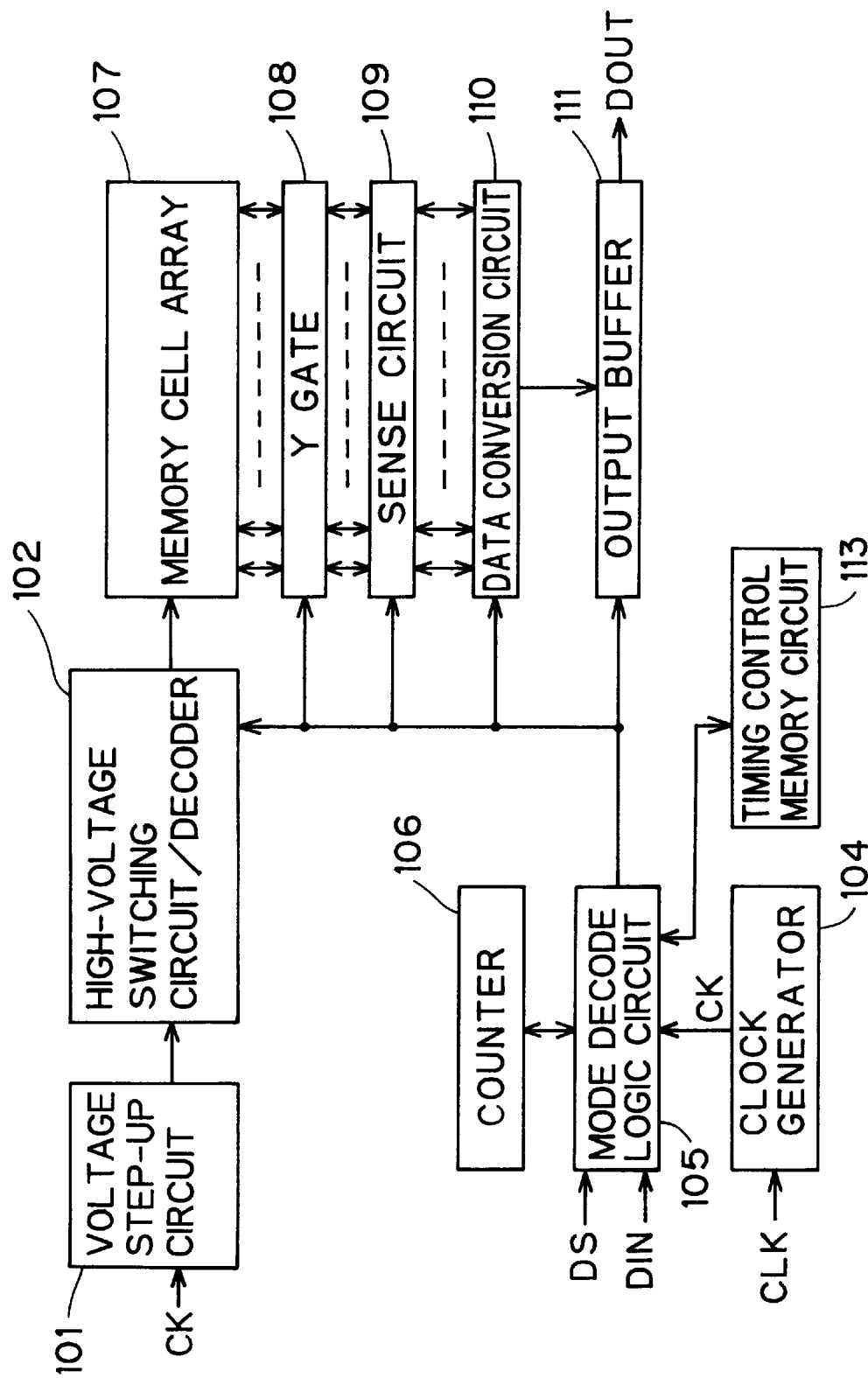
FIG. 8 is a block diagram of the EEPROM device of a second embodiment of the invention.

A second embodiment of the present invention will be described below with reference to FIGS. 8 to 15. FIG. 8 is a block diagram of the EEPROM device of the second embodiment. The EEPROM device of this embodiment has a two-bits-per-cell configuration, and inputs and outputs data by the use of a serial signal. The mode decode logic circuit 105 recognizes various instruction codes, addresses, and other data by receiving a chip select signal CS and a data input signal DIN, and, in accordance thereto, performs various operations such as writing and reading of data.

The clock generator 104 is an oscillation circuit for generating a clock. It feeds the mode decode logic circuit 105 with a clock CK that is synchronous with the clock CLK fed from outside. Moreover, the clock generator 104 feeds the clock CK also to the voltage step-up circuit 101 for the stepping-up of a voltage.

The timing control memory circuit 113 is a data-storage device for storing data representing the length of time for which the erasing and writing of data is performed, and is composed of ordinary memory cells each capable of storing data in either of two states having different values. When the supply of power is started, the data stored in the timing control memory circuit 113 is read out by the mode decode logic circuit 105, and, in accordance with this data, the length of the writing time is controlled. The voltage step-up circuit 101 is provided with, for example, a voltage step-up capacitor consisting of a plurality of capacities, and serves to increase a voltage stepwise by adding the clock to the voltage held across those capacitors. Thus, the voltage step-up circuit 101 produces a high voltage Vpp.

The high-voltage switching circuit/decoder 102 has a circuit for switching the power source voltage between a normal power source voltage and the high voltage Vpp, a circuit for letting the high voltage Vpp pass through the switching circuit only for the length of time that corresponds to the time-length signal fed from the mode decode logic circuit 105, and a decoder for decoding the address signal fed from the mode decode logic circuit 105. The high voltage Vpp is used to perform the writing and erasing of data to and from the memory cells. As will be described later, the time-length signal (which represents the length of the writing time) is variable in accordance with the time data stored in the timing control memory circuit 113.

The memory cell array 107 is composed of nonvolatile data-storage elements that are electrically rewritable, and stores data by the use of three states each representing a different value. The Y gate 108 decodes the address signal fed from the mode decode logic circuit 105. The sense circuit 109 evaluates the data at that address within the memory cell array 107 which is specified by the high-voltage switching circuit/decoder 102 and the Y gate.

During the writing of data, the data conversion circuit 110 converts the data (FIG. 12) fed from the mode decode logic circuit 105 into the two-bits-per-cell format as shown in FIG. 13. On the other hand, during the reading of data, the data conversion circuit 110 converts the read-out data into a serial signal and feeds it to the output buffer 111. The output buffer 111 holds the read-out data temporarily, and outputs a serial signal DOUT.

When data is read out from this EEPROM device, the signal DIN, which includes a read instruction code and an address, is fed to the mode decode logic circuit 105 in synchronism with the clock CK. On recognizing the read instruction code, the mode decode logic circuit 105 reads out the data at the address that is specified by the high-voltage switching circuit/decoder 102 and the Y gate 108, and evaluates the data by the use of the sense circuit 109. Then, the data is converted into a serial signal by the data conversion circuit 110, and is outputted as the signal DOUT from the output buffer 111.

When time data is stored in the timing control memory circuit 113, the signal DIN, which this time includes a corresponding instruction code and the data to be stored, is fed to the mode decode logic circuit 105 in synchronism with the clock CK. This causes the mode decode logic circuit 105 to write the data in the timing control memory circuit 113.

The erasing and writing of data are performed by the use of the high voltage Vpp produced by the voltage step-up circuit 101. When the supply of power is started, the mode decode logic circuit 105 reads out the data representing the length of the writing time from the timing control memory circuit 113 and, in accordance thereto, controls the length of time for which the erasing and writing are performed.

When input data is written to the memory cell array 107, the signal DIN, which this time includes a write instruction code, an address, and the data to be written, is fed to the mode decode logic circuit 105 in synchronism with the clock CK. On recognizing the write instruction code, the mode decode logic circuit 105 converts the input data into the two-bit-per-cell format by the use of the data conversion circuit 110, and then writes the data to the memory cell that is specified by the high-voltage switching circuit/decoder 102 and the Y gate 108.

The high-voltage switching/decoder 102 can switch between the normal power source voltage and the high voltage Vpp, for example, by the use of a transistor designed for switching operations.

Figure 9:
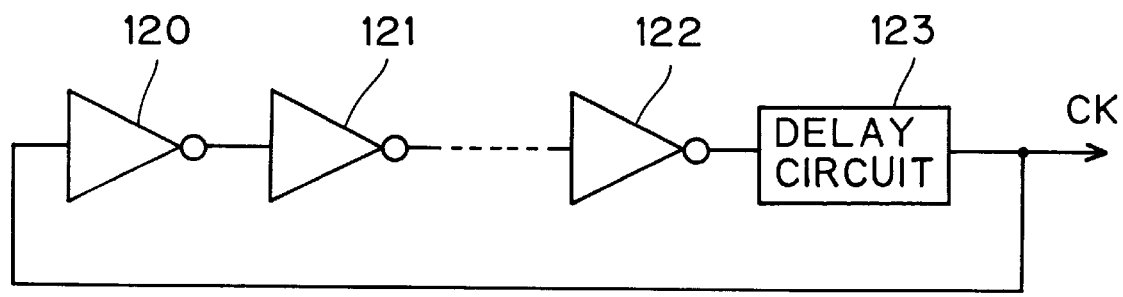
FIG. 9 is a block diagram of the ring oscillator used in the second embodiment.

The clock generator 104 has, as shown in FIG. 9, a ring oscillator. The ring oscillator is composed of an odd number of inverters (inverting amplifiers) 120, 121, . . . , 122 connected in series, and its output is fed back to its input through a delay circuit 123. This causes the clock generator 104 to output the clock CK. The clock generator 104 operates in synchronism with the clock CLK fed from outside. In this EEPROM device, the time data is determined basically in the same manner as shown in FIG. 2.

Figure 11:
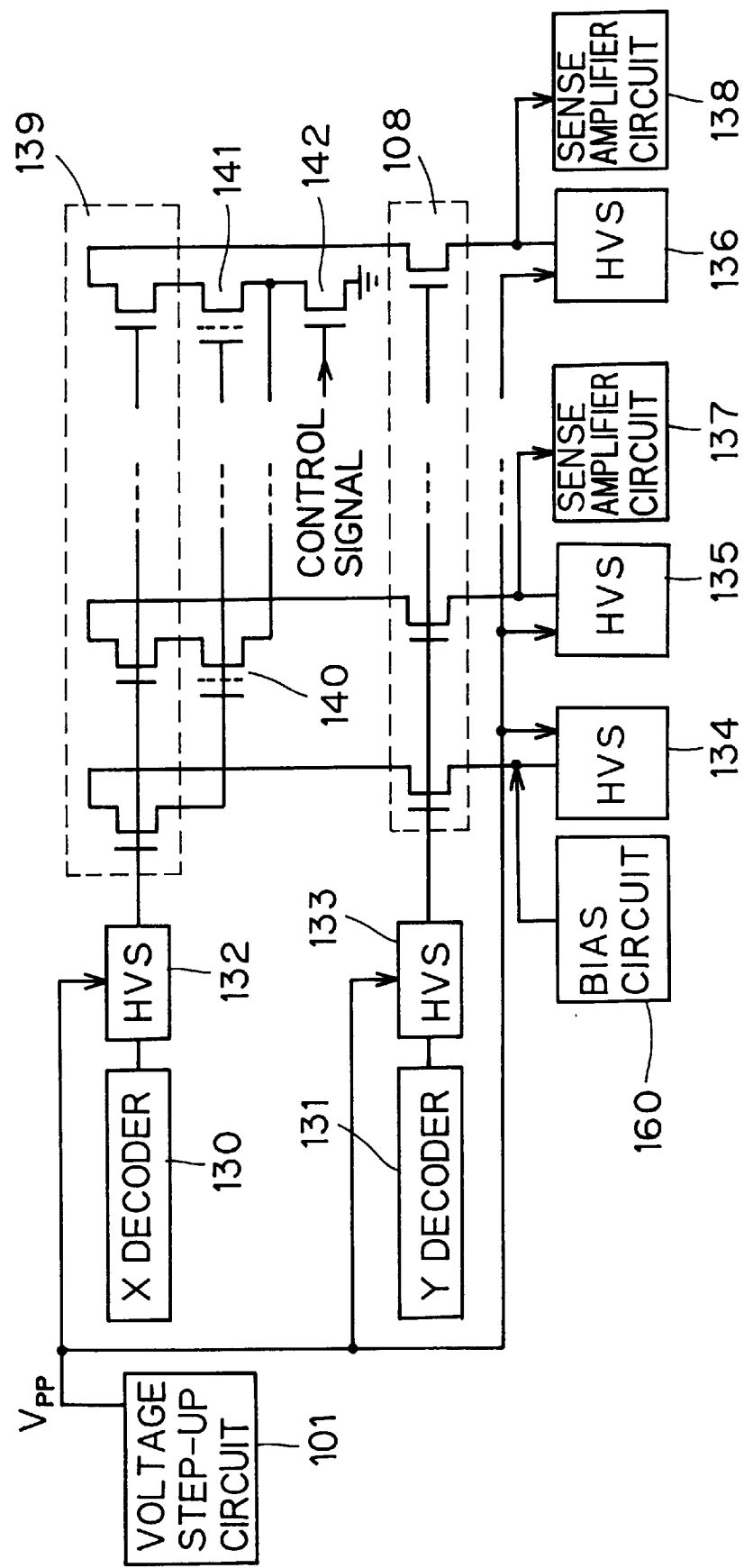
FIG. 11 is a circuit diagram of the circuit around the memory cells in the second embodiment.

Next, a description will be given as to the operation for writing input data to the memory cell array 107. FIG. 11 is a circuit diagram of the memory cells and the circuit around them in the memory cell array 7. The high voltage Vpp that is required for the rewriting and erasing of data is obtained from the voltage step-up circuit 101, and is applied to the memory cells 140, . . . , 141 through high-voltage switching circuits (HVS) 132 to 136. The X decoder 130 and the Y decoder 131 operate in accordance with the address signal fed from the mode decode logic circuit 105. In accordance with the address specified, the X decoder 130 opens the select gate 139, and the Y decoder 131 opens the Y gate 108.

When data is erased, by the use of the high-voltage switching circuit 134, the high voltage Vpp is applied to the control gate of each of the memory cells 140, . . . , 141, and 0 V (the ground level) is applied to the corresponding drain. This allows data to be erased individually in each memory cell. When data is written, 0 V (the ground level) is applied to the control gate of each of the memory cells 140, . . . , 141 at the specified address, and the high voltage Vpp is applied to the corresponding drain.

When the transistor 142 is turned off by a control signal, the operation of the memory cells 140, . . . , 141 is inhibited. The bias circuit 160, the sense amplifier circuits 137, . . . , 138, and other circuits are, as will be described later, used in the reading operation.

With the two-bits-per-cell configuration, it is inevitable, as described previously, to rearrange data from an arrangement as shown in FIG. 12 to an arrangement as shown in FIG. 13. For example, when the input data is binary data consisting of eight bits D1–D8, it needs to be converted into data that fills four cells in a manner like "D1, D2", "D3, D4", "D5, D6", and "D7, D8". If it is assumed that, in FIG. 11, the memory cells 140, . . . , 141 can store eight-bit data, then there must be four of the memory cells 140, . . . , 141. Thus, the bits D1 and D2 of the data are stored in the memory cell 141, and the other bits are stored in the due memory cells, with the bits D7 and D8 stored in the memory cell 140.

Each of the memory cells 140, . . . , 141 realizes four-valued states in the following manner. First, as shown in FIG. 5A, in each cell, the voltage Vpp is applied to the control gate 80, and the voltage at the drain 84 is dropped to 0 V (the ground level), so that electrons are injected into the floating gate 81 and thereby the data is erased. Thereafter, two types of writing as shown in FIGS. 5B and 5C are combined.

In FIGS. 5B and 5C, the control gate 80 is kept at 0 V, and the drain 84 is kept at the voltage Vpp. The above-mentioned two types of writing, hereafter referred to as the writing (1) and the writing (2) respectively, have different writing times, so that, when combined, they allow the writing of data to be performed with four different writing times in total, including the case where neither the writing (1) nor the writing (2) is performed. In this way, it is possible to store data by the use of four-valued states.

Specifically, different numbers of electrons are ejected in "erasing", "erasing+writing (1)", "erasing+writing (2)", and "erasing+writing (1)+writing (2)". This makes it possible to realize four-valued states as shown in FIG. 6B.

Figure 10:
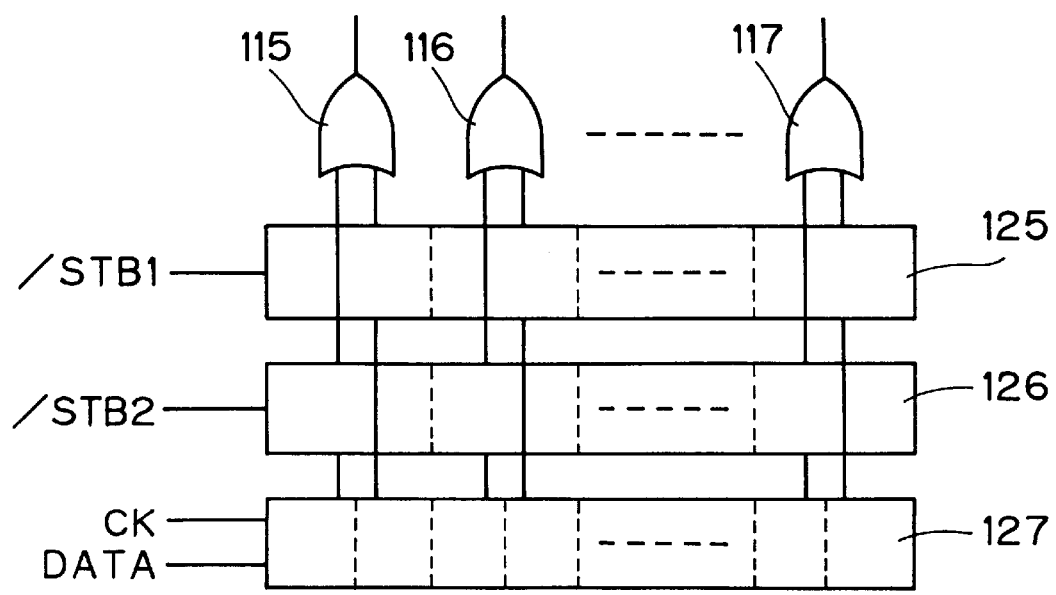
FIG. 10 is a circuit diagram of the data conversion circuit used in the second embodiment.

FIG. 10 shows an example of the data conversion circuit 110 for achieving the data conversion shown in FIGS. 12 and 13. The clock CK and the input data DATA are fed to the shift register 127. The data is then distributed between the odd-number register 125 and the even-number register 126. The signals (/STB1) and (/STB2) are produced by the mode decode logic circuit 105 by the use of the counter 106 in accordance with the data stored in the timing control memory circuit 113.

Figure 14:
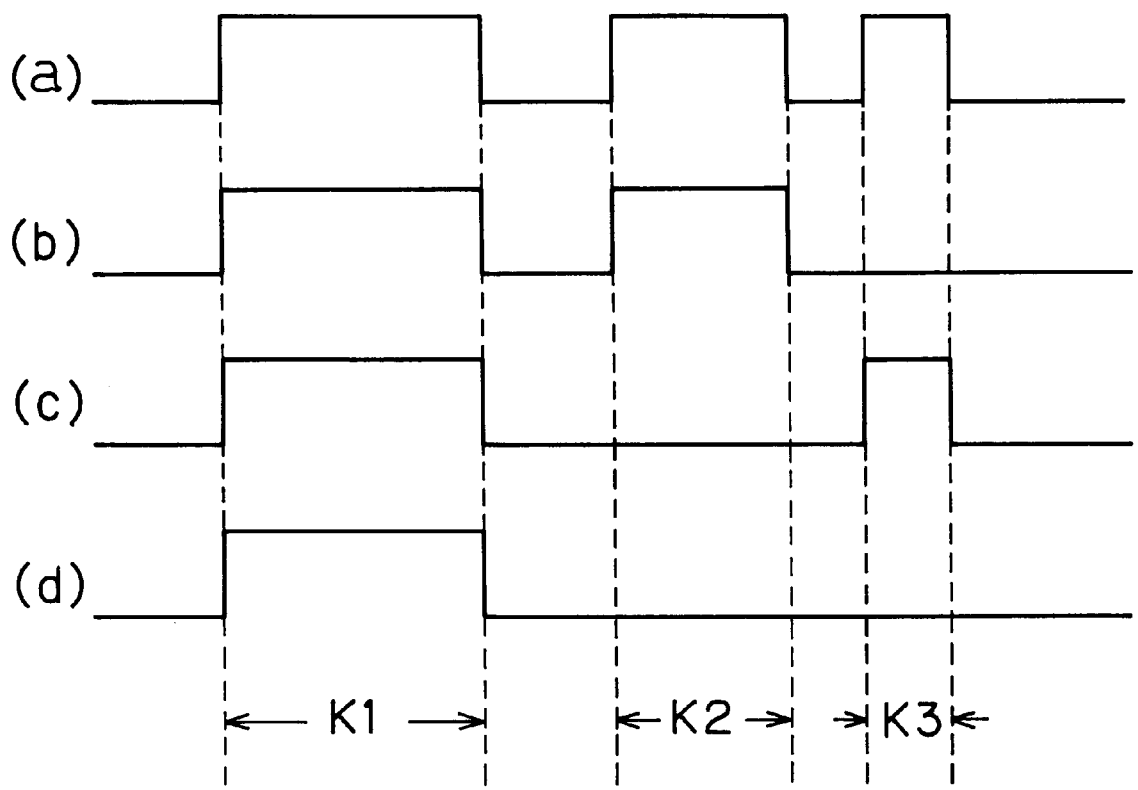
FIG. 14 is a waveform chart explaining the data storage operation performed in the second embodiment.

As will be described later, the signal (/STB1) is a signal that has a length of time equal to the interval K2 (see FIG. 14), during which time the register 125 outputs data. In FIG. 14, the signal (/STB1) is a signal that has a length of time equal to the interval K3, during which time the register 126 outputs the nth item of the data stored therein (where n represents an odd number).

In the example shown in FIGS. 12 and 13, the outputs of the registers 125 and 126 are converted by the OR circuits 115, 116, . . . , 117 into signals that fill four cells. In accordance with these signals, data is written to the memory cell array 107 (see FIG. 8). On the other hand, the data read out from the memory cell array 107 is, in the data conversion circuit 110, converted into a serial signal by the shift register and is then outputted to the output buffer 111.

FIG. 14 shows how data is stored in the memory cell array 107. In each memory cell, when the two-bit data is "1, 1", then, as shown at (a), the writing (1) is performed in the interval K2 after the erasing interval K1, and thereafter the writing (2) is performed in the interval K3. Here, to make the number of injected electrons equal to the number of ejected electrons, the length of the erasing interval K1 is made equal to the total length of the intervals K2 and K3.

When the data is "1, 0", then, as shown at (b), the writing (1) is performed after the erasing interval K1, and the writing (2) is not performed. When the data is "0, 1", then, as shown at (c), the writing (2) is performed after the erasing interval K1, and the writing (1) is not performed. When the data is "0, 0", then, as shown at (d), neither the writing (1) nor the writing (2) is performed after the erasing interval K1.

To allow data to be written by the use of four-valued states realized by the writing (1) and the writing (2), the lengths of the intervals K2 and K3 are made different from each other. In the example shown in FIG. 13, the "writing (1)" causes the bits D1, D3, D5, and D7 to be written, and the "writing (2)" causes the bits D2, D4, D6, and D8 to be written.

As described previously, in the mode decode logic circuit 105, by counting the clock (CK) fed from the clock generator by the use of the counter 106 in accordance with the data stored in the timing control memory circuit 113, the lengths of the intervals K1, K2, and K3 are varied. Specifically, where the electron ejection and injection characteristics are good, the lengths of the intervals K1, K2 and K3 are made longer, and, where those characteristics are poor, the lengths of those intervals are made shorter. This is achieved simply by storing, in the timing control memory circuit 113, the value at which the counter 106 is to be reset.

Figure 15:
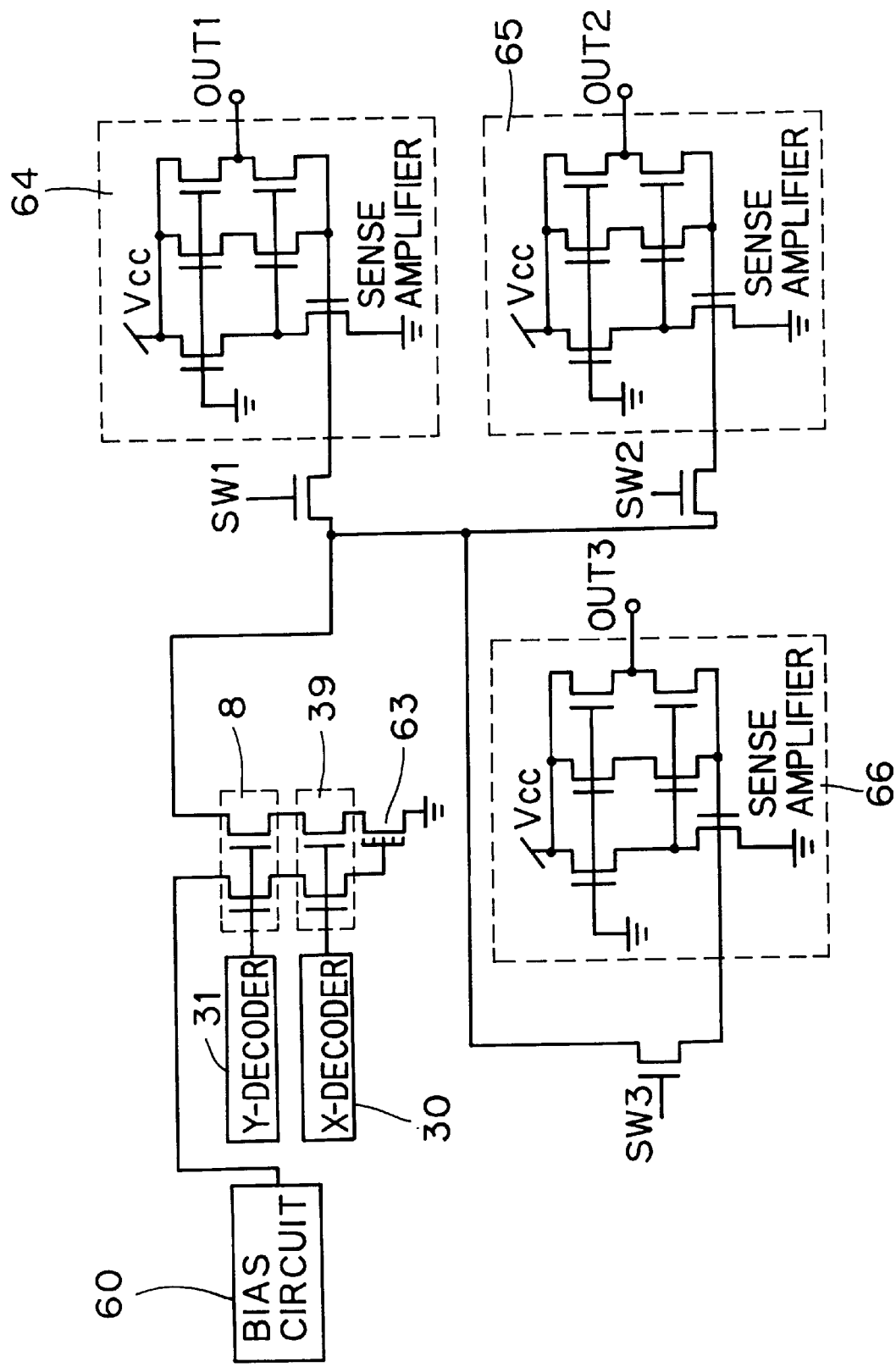
FIG. 15 is a circuit diagram of the circuit around the sense amplifier circuit in the second embodiment.
Figure 16:
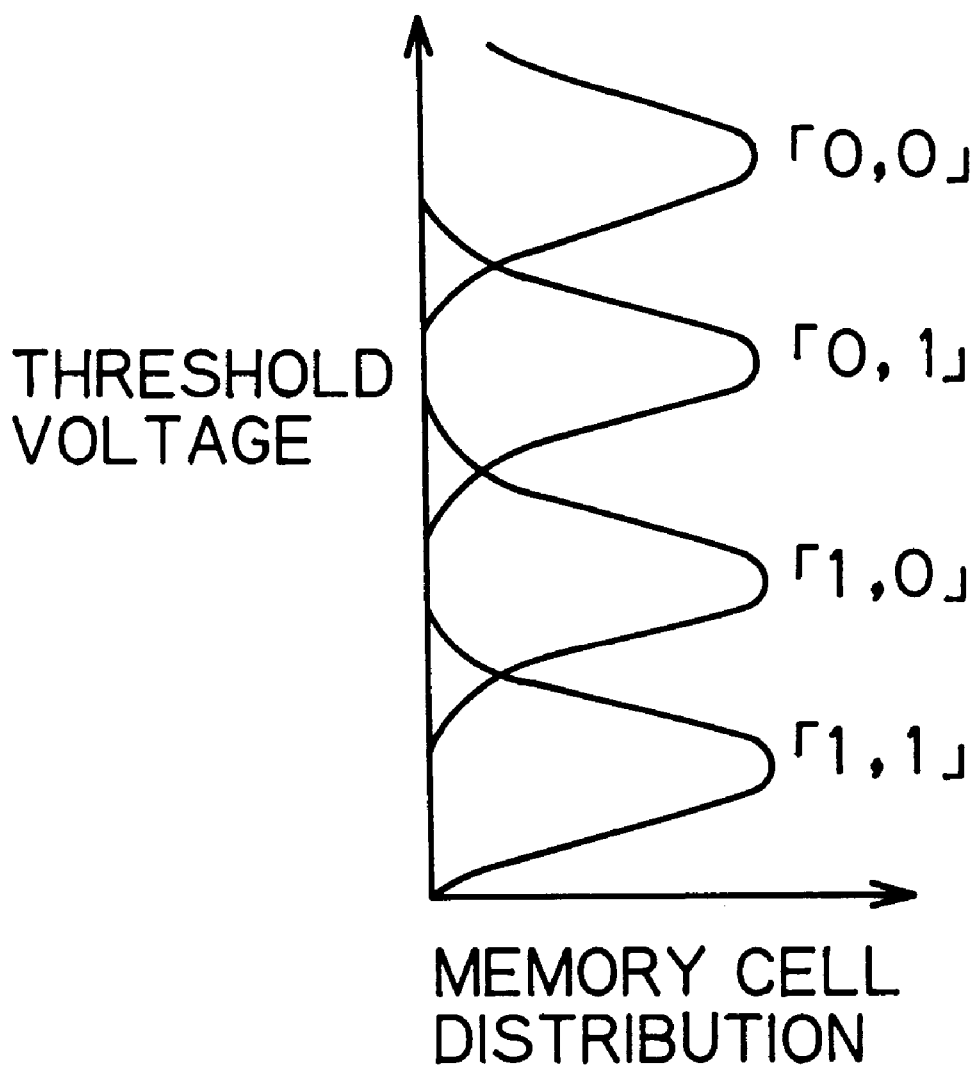
FIG. 16 is a diagram illustrating the prior art memory cell distribution in terms of their threshold voltage.

Next, a description will be given as to the reading circuit. FIG. 15 shows the circuit diagram of the circuit for reading out data from a memory cell. To allow data represented in four-valued states to be discriminated by the use of three reference voltages V1, V2, and V3 (see FIG. 7) in the manner described earlier, the reading circuit is provided with three sense amplifiers 164 to 166. The sense amplifiers 164 to 166 are each provided with a switching device, SW1 to SW3 respectively; these switching devices SW1 to SW3 are successively turned on, one at a time, during the reading of data.

When data is read out from the memory cell 163, the corresponding X decoder 130 opens the select gate 139, and the corresponding Y decoder 131 opens the Y gate 108. Thereafter, when a voltage is applied between the drain and the control gate of the memory cell 163, for example, by the use of the sense amplifier 164 and the bias circuit 160, the current that flows through the memory cell 163 causes the sense amplifier 164 to turn its output OUT1 to a low level or to a high level.

The sense amplifiers 165 and 166 operate in the same manner. Here, if each of the sense amplifiers 164 to 166 is composed of transistors having a different threshold voltage from those used in the others, the sense amplifiers 164 to 166 can discriminate data by the use of three different reference voltages V1, V2, and V3.

The sense amplifier 164, by the use of the reference voltage V1, discriminates "0, 0" from "0, 1", "1, 0", and "1, 1". The sense amplifier 165, by the use of the reference voltage V2, discriminates "0, 0" and "0, 1" from "1, 0" and "1, 1". The sense amplifier 166, by the use of the reference voltage V3, discriminates "0, 0", "0, 1" and "1, 0" from "1, 1".

In this way, the outputs OUT1 to OUT3 of the sense amplifiers 164 to 166 makes the discrimination between two-bit data possible. The data, after the discrimination, is converted into a serial signal by the data conversion circuit 110, and is then stored in the output buffer 111 temporarily. The output buffer 111 outputs the serial signal DOUT. Since it is impossible to discriminate data with all the switching devices simultaneously on, the timing with which one switching device is turned on is shifted with respect to the timing for the others so that the discrimination will be performed by only one sense amplifier at a time.

As described heretofore, in this embodiment, the input data is first converted into the two-bits-per-cell format by the data conversion circuit 110, and, in each cell, the writing time is varied stepwise as shown in FIG. 14 in accordance with the value of a given two-bit data. Thus, it is possible to store data by the use of three or more multivalued states as used in the two-bits-per-cell system.

Even with EEPROM devices that exhibit large lot-to-lot variations in the characteristics of the memory cells in their manufacturing process, it is possible to set the data representing the length of the writing time before the shipment. Thus, even with EEPROM devices that are mass-produced, simply by adjusting this data, it is possible to obtain stable operation characteristics with respect to the predetermined reference voltages. This contributes to an increased yield.

Moreover, not only with the two-bits-per-cell system, but also with any system in general that handles three or more bits per cell, it is possible, in storing data in the memory cells by the use of multivalued states, to obtain stable data-writing characteristics simply by storing appropriate time data in the EEPROM device in the inspection process.

Although the EEPROM device of the above embodiment is of the type that inputs and outputs data by the use of a serial signal, but it may be of the type that inputs and outputs data by the use of parallel signals. Instead of reading the time data when the supply of power is started, it is also possible to monitor the occurrence of writing and other operations so that the time data is read out when a writing or other operation is performed for the first time.

The data that is stored in the timing control memory circuit 113 is set in the EDS process. Accordingly, it is also possible to use a polyfuse instead so that the time data is set chip by chip by the use of a laser trimmer. However, this may leads to an increased chip area because the polyfuse requires sufficient extra space to place position indication marks that are referred to when the polyfuse is cut with a laser beam and to prevent the effect of the cutting on the portion around the polyfuse. It is therefore advisable, as in the above embodiment, to compose the timing control memory circuit 113 by the use of memory cells that store data in two-valued states.

What is claimed is:

1. An EEPROM device comprising:
   an array of memory cells composed of nonvolatile data-storage elements for electrical writing and erasing of data;
   a first area, provided in said array of memory cells, for storing data representing a writing time;
   a second area, provided in said array of memory cells, for storing input data;
   latch means for latching the writing-time data read out from said first area;
   a counter for counting a clock up to a predetermined count, said counter using the data latched in said latch means as the predetermined count; and
   a circuit for setting a length of time for which the input data is written to said second area to be equal to an interval in which said counter outputs a count output.

2. An EEPROM device comprising:
   an array of memory cells composed of nonvolatile data-storage elements for electrical writing and erasing of data;
   storage means for storing data representing a writing time; and
   means for setting a length of time for which input data is written to said array of memory cells in accordance with the writing-time data stored in said storage means.

3. An EEPROM device as claimed in claim 2,
   wherein said writing time consists of time used for erasing and time used for writing.

4. An EEPROM device as claimed in claim 2,
   wherein the writing-time data stored in said storage means represents a length of time that does not cause dielectric destruction of tunnel oxide films of said array of memory cells and that permits sufficient injection and ejection of electrons.

5. An EEPROM device as claimed in claim 2,
   wherein each memory cell is brought into one of multi-valued states for storage of data.

6. An EEPROM device as claimed in claim 2,
   wherein said storage means stores a plurality of writing times and said multivalued states correspond one to one to said plurality of writing times.

7. An EEPROM device according to claim 2, wherein said storage means is composed of nonvolatile data-storage elements.

* * * * *